(12) United States Patent
Takeuchi et al.

(10) Patent No.: US 6,876,091 B2
(45) Date of Patent: Apr. 5, 2005

(54) WIRING BOARD

(75) Inventors: Hiroki Takeuchi, Komaki (JP);
Toshifumi Kojima, Komaki (JP);
Kazushige Obayashi, Nagoya (JP);
Hisahito Kashima, Nagoya (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 10/024,581

(22) Filed: Dec. 21, 2001

(65) Prior Publication Data

US 2002/0132096 A1 Sep. 19, 2002

(30) Foreign Application Priority Data

Dec. 25, 2000 (JP) ........................................ 2000-393588
Aug. 27, 2001 (JP) ........................................ 2001-255778
Nov. 19, 2001 (JP) ........................................ 2001-352481

(51) Int. Cl.[7] ............................. H01L 23/29; H05K 1/18
(52) U.S. Cl. ...................... 257/793; 257/687; 257/795; 257/789; 361/762
(58) Field of Search ................................. 257/788, 793, 257/782, 778, 687, 700

(56) References Cited

U.S. PATENT DOCUMENTS

| | | | | |
|---|---|---|---|---|
| 5,292,688 A | * | 3/1994 | Hsiao et al. | 437/209 |
| 5,468,999 A | * | 11/1995 | Lin et al. | 257/784 |
| 5,589,714 A | * | 12/1996 | Howard | 257/788 |
| 5,627,107 A | * | 5/1997 | Howard | 264/272.17 |
| 5,828,126 A | * | 10/1998 | Thomas | 257/695 |
| 6,129,955 A | * | 10/2000 | Papathomas et al. | 427/517 |
| 6,324,067 B1 | * | 11/2001 | Nishiyama | 361/761 |

FOREIGN PATENT DOCUMENTS

| | | |
|---|---|---|
| JP | 4-356998 | 12/1992 |
| JP | 6-326472 | 11/1994 |
| JP | 7-263619 | 10/1995 |
| JP | 11-45955 | 2/1999 |
| JP | 11-54939 | 2/1999 |
| JP | 11-67961 | 3/1999 |
| JP | 11-74648 | 3/1999 |
| JP | 11-126978 | 5/1999 |
| JP | 11-307687 | 11/1999 |
| JP | 2000-124352 | 4/2000 |

* cited by examiner

Primary Examiner—Cathy F. Lam
(74) Attorney, Agent, or Firm—Morgan, Lewis & Bockius LLP

(57) ABSTRACT

The present invention provides a wiring board in which electronic components are embedded by means of an embedding resin which attains a high mounting density of the electronic components in the wiring board, which exhibits excellent electrical properties such as insulating property, which prevents random reflection of light, and which reduces non-uniformity in color of the resin during curing thereof. The present invention includes a wiring board in which electronic components are embedded by use of an embedding resin having a dielectric constant of less than or equal to about 5 and tan δ of less than or equal to about 0.08. The embedding resin preferably contains carbon black in an amount of less than or equal to about 1.4 mass %. Moreover, the embedding resin preferably contains at least a thermosetting resin and at least one inorganic filler.

8 Claims, 25 Drawing Sheets

WIRING BOARD

This application claims the benefits of priority under 35 U.S.C. § 119(a) of Japanese Priority Application No. 2001-352481, filed Nov. 19, 2001; No. 2001-255778, filed Aug. 27, 2001; and No. 2000-393588, filed Dec. 25, 2000, which are hereby incorporated by reference.

BACKGROUND OF INVENTION a. Field of Invention

The present invention relates to a wiring board including an insulating substrate in which electronic components, such as chip capacitors, chip inductors, or chip resistors, are embedded. More particularly, the present invention relates to a wiring board suitable for use in, for example, a multi-layer wiring board or a package for storing semiconductor elements.

b. Description of Related Art

In recent years, various studies have been performed on multi chip modules (MCMs) in which a number of semiconductor elements are mounted on a build-up wiring board. Typically, electronic components, such as chip capacitors, chip inductors, and chip resistors are soldered onto the surface of a wiring layer formed on the surface of the wiring board.

When electronic components are mounted on the surface of the build-up wiring board, since the components require predetermined regions for mounting, a limitation is imposed on miniaturization of the wiring board. Also, depending on the wiring layout for surface mounting, parasitic inductance of the wiring (which is an undesirable property) becomes large. Parasitic inductance of the wiring also hampers incorporation of such wiring boards into electronic devices of higher frequency.

In order to solve the aforementioned problems, various studies have been performed on methods for embedding electronic components in an insulating substrate. Japanese Patent Application Laid-Open (kokai) No. 11-126978 discloses a method in which electronic components are mounted by soldering, in advance, on a wiring board having a transfer sheet formed from metallic foil, and then the electronic components are transferred. However, this method has problems in terms of accuracy in the positions of the mounted components.

Japanese Patent Application Laid-Open (kokai) No. 2000-124352 discloses a multi-layer wiring board in which an insulating layer is built up on electronic components embedded in a core substrate. When an electronic component is embedded in an insulating substrate such as a core substrate, after a space between the substrate and the electronic component is filled with an embedding resin, and an insulating layer and a wiring layer are built up on the substrate, the electrode of the electronic component must be electrically connected to the wiring formed on the insulating layer, through a metalization technique such as electroless plating.

The embedding resin is preferably colored black in order to prevent random reflection of light, which would otherwise raise problems when a wiring pattern is formed on the built-up insulating layer through exposure and development, or to reduce non-uniformity in the color of the resin during curing of the resin. Therefore, carbon or a similar material must be incorporated as a coloring agent into the resin.

However, when carbon, which is conductive, is excessively incorporated into the embedding resin, the insulating property of the resin deteriorates. Therefore, it is important to design the method for coloring the resin black so that random reflection of light is prevented and non-uniformity in color of the resin is reduced during curing of the resin, with the insulating property between electronic components or between wiring portions formed on the insulating layer being maintained.

A problem arising when a wiring board is used under high-frequency conditions is loss of electrical signals in high-frequency regions. In order to reduce such loss of electrical signals, an embedding resin used for embedding electronic components in the wiring board must have low dielectric constant and exhibit low dielectric loss.

SUMMARY OF THE INVENTION

An object of the present invention is to provide a wiring board in which electronic components are embedded by use of an embedding resin which is capable of attaining high mounting density of the electronic components in the wiring board, which exhibits excellent electrical properties, such as insulating property, which prevents random reflection of light, and which reduces non-uniformity in the color of the resin during curing thereof.

Thus, the present invention provides a wiring board including, an electronic component and an embedding resin having a dielectric constant of less than or equal to about 5 and tan δ of less than or equal to about 0.08, wherein, the electronic component is embedded in the embedding resin.

The embedding resin includes carbon black in an amount of less than or equal to about 1.4 mass %.

The embedding resin further includes a thermosetting resin as a resin component and at least one inorganic filler.

The thermosetting resin is at least one of a bisphenol-type epoxy resin, a naphthalene-type epoxy resin, a phenol-novolak-type epoxy resin, or a cresol-novolak-type epoxy resin.

The embedding resin assumes a color having a base color tone of black, blue, green, red, orange, yellow, or violet.

The wiring board further includes a substrate, including a build-up layer formed by laminating an insulating layer and a wiring layer in alternate fashion, formed on at least one surface of a core substrate, and an opening formed so as to penetrate at least one of the core substrate and the build-up layer, wherein the electronic component is placed in the opening and embedded by means of the embedding resin.

BRIEF DESCRIPTION OF THE DRAWINGS

The accompanying drawings, which are included to provide a further understanding of the invention and are incorporated in and constitute a part of this specification, illustrate preferred embodiments of the invention and together with the detail description serve to explain the principles of the invention. In the drawings.

DETAILED DESCRIPTION OF THE PREFERRED EMBODIMENTS

Figure 10:
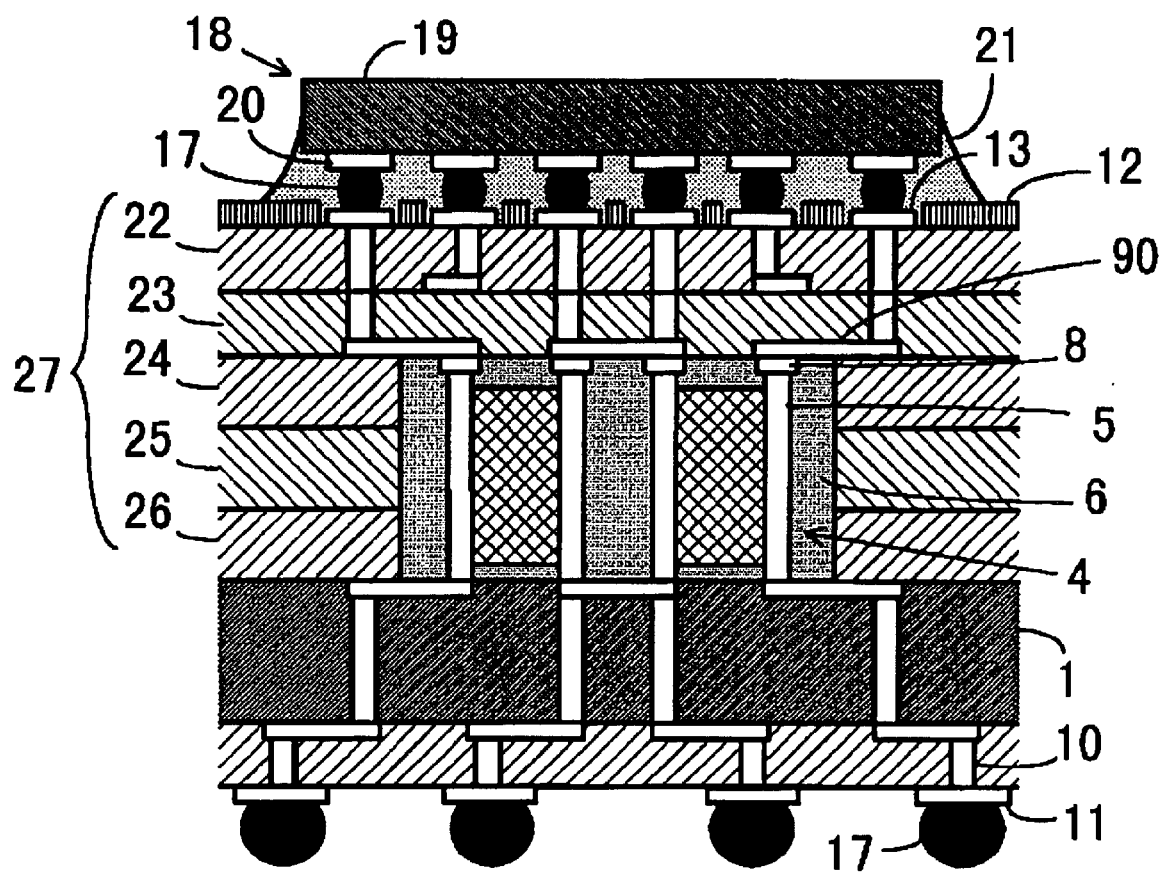
FIG. 10 is an explanatory view showing a BGA board formed from a wiring board of the present invention.
Figure 11:
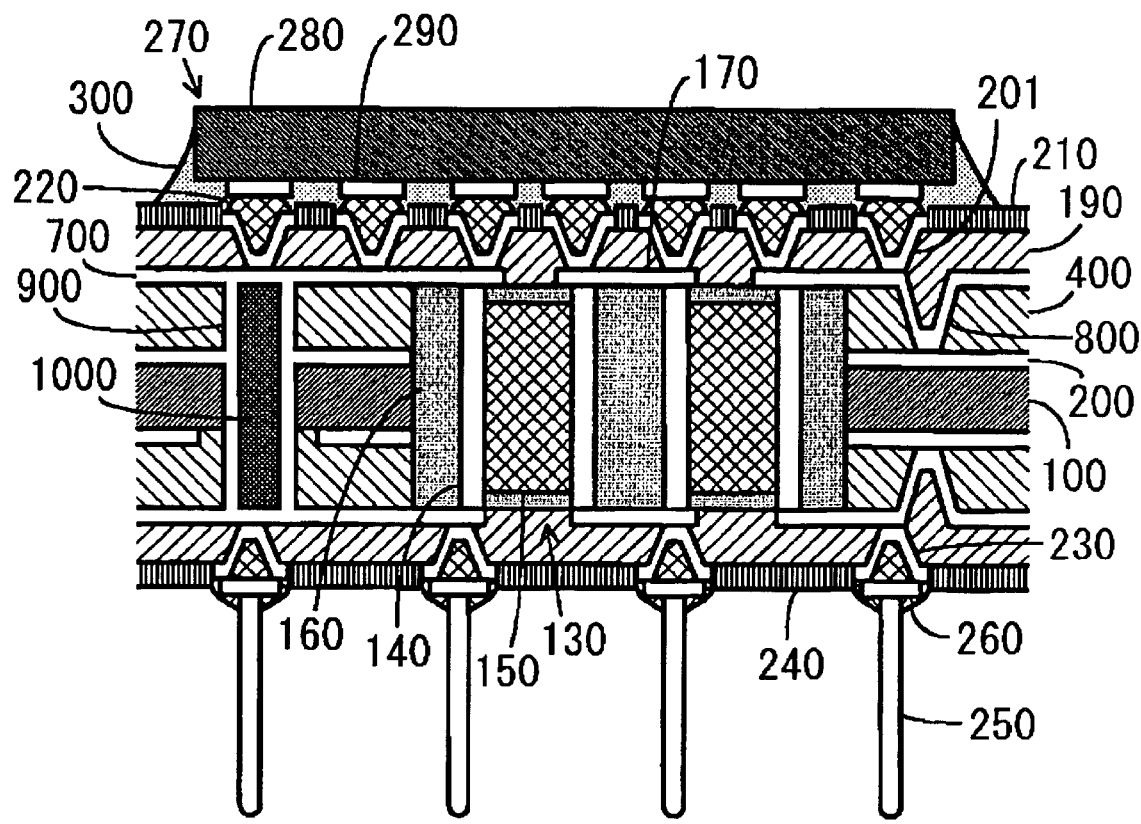
FIG. 11 is an explanatory view showing a semiconductor device formed from an FC-PGA-type multi-layer printed wiring board, which is an embodiment of the present invention.

The present invention provides a wiring board including an electronic component and an embedding resin having a dielectric constant of less than or equal to about 5 and tan $\delta$ of less than or equal to about 0.08, the electronic component being embedded in the embedding resin. As used herein, the expression "embedding an electronic component" refers to the case where an electronic component is placed in an opening (e.g., a through hole or a depression such as a cavity) provided in an insulating substrate such as a core substrate or in a built-up insulating layer, and then a space formed between the electronic component and the opening is filled with an embedding resin. Specifically, when a thin core substrate having a thickness of less than or equal to about 400 $\mu$m is employed, electronic components are preferably placed in a cavity provided in a build-up layer. The opening may be a through hole formed in a substrate through punching, or a cavity formed by means of multi-layer lamination. The substrate used in the present invention is preferably a core substrate, such as FR-4, FR-5, or BT. However, the substrate used in the present invention may be a substrate in which an opening is formed in a core substrate formed by sandwiching a copper foil having a thickness of about 35 $\mu$m between sheets of a thermoplastic resin such as PTFE. Alternatively, the substrate used in the present invention may be a substrate in which a build-up layer (which is formed by laminating an insulating layer and a wiring layer in alternate fashion) is formed on at least one surface of a core substrate, and an opening is formed so as to penetrate the core substrate and the build-up layer. When this substrate is used for forming a multi-layer wiring board including capacitors as shown in FIG. 11, the thickness of the core substrate (insulating substrate) formed from a glass-epoxy composite material is advantageously reduced to about 400 $\mu$m (i.e., half the thickness of a typical core substrate (about 800 $\mu$m)). Therefore, the height of the wiring board can be reduced. In other example applications, this substrate can be employed for forming a wiring board including electronic components embedded in a core substrate (see FIG. 1) or a wiring board including electronic components embedded in a build-up layer (see FIG. 10).

Examples of the aforementioned electronic component include passive electronic components such as chip capacitors, chip inductors, chip resistors, and filters; active electronic components such as transistors, semiconductor elements, FETs, and low-noise amplifiers (LNAs); and other electronic components such as SAW filters, LC filters, antenna switch modules, couplers, and diplexers.

When the dielectric loss of the embedding resin is large, transfer loss of electrical signals in a wiring board increases, which is not desirable. When tan $\delta$ of the embedding resin, which is an index of the degree of dielectric loss of the resin, is determined to be less than or equal to about 0.08, transfer loss of electrical signals in a wiring board can be reduced. In the present invention, tan $\delta$ is preferably less than or equal to about 0.05, more preferably less than or equal to about 0.04, much more preferably less than or equal to about 0.03, still more preferably less than or equal to about 0.02.

Preferably, the embedding resin contains carbon black formed of fine particles. Carbon black may be incorporated into the resin in an amount of less than or equal to about 1.4 mass %. When carbon black is incorporated into the embedding resin, insulating reliability and dielectric properties of the resin can be improved, and random reflection of light can be prevented, which would otherwise raise problems when a wiring pattern is formed through exposure and development on an insulating layer built up on the embedding resin. Further, non-uniformity in color of the resin can be reduced during curing of the resin. Preferably, the amount of carbon black is less than or equal to about 1.0 mass %, which results in the prevention of reduction of volume resistance of the resin, and thereby improvement of the electrical characteristics.

In order to effectively solve problems related to formation of a wiring pattern through exposure and development, carbon black is incorporated into the embedding resin in an amount of about 0.1–1.4 mass %. The amount of carbon black is preferably about 0.1–1.0 mass %, more preferably about 0.1–0.5 mass %, much more preferably about 0.1–0.3 mass %.

When the incorporation amount of carbon black exceeds about 1.4 mass %, the dielectric properties and electrical characteristics of the embedding resin drastically deteriorate. Specifically, tan δ of the resin, which is an index of the degree of dielectric loss of the resin, exceeds about 0.08, and the dielectric constant of the resin exceeds about 5. In addition, the volume resistance of the resin, which is an index of insulating property of the resin, becomes less than about $1.0 \times 10^{14}$ Ω·cm.

The embedding resin used in the wiring board of the present invention may contain a thermosetting resin as a resin component, and at least one inorganic filler. When the embedding resin contains at least a thermosetting resin, the embedding resin can be easily cured through heat treatment after charging of the resin. When an epoxy resin is used as the thermosetting resin, epoxy groups may be directly subjected to cationic polymerization by use of a photo-polymerization initiator such as a dialuriodonium salt.

In order to perform pre-curing prior to main curing, the thermosetting resin may contain a photosensitive resin. For example, the thermosetting resin may contain a photosensitive resin having an acryloyl group. When an epoxy resin is used as the thermosetting resin, epoxy groups may be directly subjected to photo-polymerization, by means of a photo-polymerization initiator, to thereby pre-cure the resin.

The thermosetting resin is preferably an epoxy resin. Specifically, the thermosetting resin is preferably at least one specie selected from a group including a bisphenol-type epoxy resin, a naphthalene-type epoxy resin, a phenol-novolak-type epoxy resin, and a cresol-novolak-type epoxy resin. Since a cured epoxy resin has a three-dimensional network structure, the cured embedding resin is not broken even after being subjected to roughing treatment, which is performed for improving the strength of adhesion between the resin and wiring by means of the anchor effect.

When the fluidity of the embedding resin is poor, a space between electrodes of an electronic component tends to be insufficiently filled with the resin, permitting local differences in the thermal expansion coefficient of the resin. Specifically, in consideration of heat resistance and moisture resistance of the embedding resin, a naphthalene-type epoxy resin exhibiting excellent heat resistance and moisture resistance is preferably used in the embedding resin.

Roughing of the embedding resin is typically performed by means of a wet method making use of an oxidizing agent, such as potassium permanganate or chromic acid. However, roughing of the embedding resin may be performed by means of a dry method making use of plasma, laser power, etc.

Incorporation of an inorganic filler into the embedding resin is advantageous in that the thermal expansion coefficient of the cured embedding resin can be regulated and breakage of the roughed embedding resin is prevented by virtue of the effect of the inorganic filler serving as an aggregate.

No particular limitation is imposed on the inorganic filler, but crystalline silica, fused silica, alumina, silicon nitride, etc., are preferred. When the inorganic filler is incorporated into the embedding resin, the thermal expansion coefficient of the resin can be effectively reduced. Therefore, reliability of the resin with respect to thermal stress can be improved.

The particle size of the inorganic filler is preferably less than or equal to about 50 µm, since a space between electrodes of an electronic component must be easily filled with the embedding resin. When the particle size exceeds about 50 µm, a space between electrodes of an electronic component tends to be stuffed with the filler, and the space is insufficiently filled with the embedding resin, so that the thermal expansion coefficient of the resin differs greatly from portion to portion. The lower limit of the particle size of the filler is preferably at least about 0.1 µm. When the particle size is less than about 0.1 µm, fluidity of the embedding resin may fail to be maintained. The particle size of the filler is preferably at least about 0.3 µm, more preferably at least about 0.5 µm. In order to lower the viscosity of the embedding resin and to fill the space with the resin sufficiently, distribution of the particle size is preferably widened.

In consideration of high fluidity and filling ability of the embedding resin, preferably, the inorganic filler assumes substantially a spherical shape. Specifically, a silica-based inorganic filler is preferred, since a spherical silica-based inorganic filler is easily available.

If desired, the inorganic filler may be subjected to surface treatment by use of a coupling agent. This is because, when the inorganic filler is subjected to surface treatment, wettability between the inorganic filler and a resin component is improved, and fluidity of the embedding resin can be improved. Examples of the coupling agent employed include a silane-based coupling agent, a titanate-based coupling agent, and an aluminate-based coupling agent.

In order to effectively avoid the aforementioned problems in relation to formation of a wiring pattern through exposure and development, the embedding resin of the present invention may be colored. This is because coloring the resin prevents random reflection of light, which would otherwise raise problems during formation of a wiring pattern on an insulating layer through exposure and development, the insulating layer being built up on the embedding resin; or non-uniformity in the color of the resin can be reduced during curing of the resin. No particular limitation is imposed on the color of the embedding resin, but preferably, the base color of the resin is any one selected from the group including black, blue, green, red, orange, yellow, and violet. When prevention of random reflection of light is an issue of particular importance, the base color of the resin is preferably black, blue, or green, with black being particularly preferred.

When the embedding resin is colored black, the following substances can be incorporated into the embedding resin: black carbonaceous powder such as carbon black, graphite, or a mixture of carbon black and graphite; powder of a black inorganic oxide such as $Cu_2O$, $CuO$, or $MnO_2$; and an azomethine-based black organic pigment such as Chromofine Black A1103.

Examples of the substance for imparting a blue color to the embedding resin include phthalocyanine-based pigments such as Phthalocyanine Blue; azo pigments such as Variamine Blue; organic pigments including anthraquinone-based pigments such as Anthraquinone Blue; and inorganic oxides such as ultramarine and cobalt blue.

Examples of the substance for imparting a green color to the embedding resin include phthalocyanine-based pigments such as Phthalocyanine Green; azo pigments such as Chrome Green; organic pigments including triphenylmethane-based pigments such as Malachite Green; and powder of inorganic oxides such as $Cr_2O_3$.

Examples of the substance for imparting a red color to the embedding resin include azo pigments such as Azo Eosine, Azo Naphthol Red, and Lithol Red; organic pigments such as quinacridone and dianthraquinonyl red; and powder of inorganic oxides such as red iron oxide and cadmium red.

Examples of the substance for imparting an orange color to the embedding resin include azo pigments such as Chrome Orange; organic pigments such as benzimidazolone; and inorganic oxides such as molybdate orange.

Examples of the substance for imparting a yellow color to the embedding resin include azo pigments such as Chrome Yellow and Hansa Yellow; quinoline-based pigments such as Quinoline Yellow; anthraquinone-based pigments such as Anthraquinone Yellow; organic pigments such as benzimidazolone and isoindolinone; and powder of inorganic oxides such as cadmium yellow, chrome yellow, and Titan Yellow.

Examples of the substance for imparting a violet color to the embedding resin include anthraquinone-based pigments such as Anthraquinone Violet; organic pigments including triphenylmethane-based pigments such as Mitsui Crystal Violet; and powder of inorganic oxides such as manganese violet.

In order to make the embedding resin assume any base color selected from among black, blue, green, red, orange, yellow, and violet, a coloring agent may be used by itself. Alternatively, coloring agents of various colors may be used in combination. In this case, pigments of red, yellow, and blue (i.e., the three primary colors) are preferably used in combination, since the embedding resin can be made to assume any desired color.

When a coloring agent, other than a conductive coloring agent such as carbon black, is incorporated into the embedding resin, the incorporation amount of the coloring agent is appropriately determined so as to attain a desired color suitable for the production process of a wiring board so that random reflection of light can be prevented or non-uniformity in color of the resin during curing thereof can be reduced.

The thickness of an insulating substrate in which an electronic component is to be embedded is preferably approximately equal to the height of the electronic component. Preferably, the height of the electronic component and the thickness of the insulating substrate are determined such that the distance between the surface of a terminal electrode of the electronic component and a wiring layer included in a build-up layer laminated on the insulating substrate is less than or equal to about 100 μm (preferably less than or equal to about 50 μm, more preferably less than or equal to about 30 μm). This is because when the distance between the electronic component and the build-up layer formed on the insulating substrate is reduced to the smallest amount attainable, generation of unwanted parasitic capacitance (e.g., inductance) can be prevented. In order to prevent generation of unwanted parasitic capacitance, preferably, there is employed a multi-layer wiring board including a substrate in which a build-up layer (which is formed by laminating an insulating layer and a wiring layer in alternate fashion) is formed on at least one surface of a core substrate, and an opening is formed so as to penetrate at least one of the core substrate and the build-up layer. Employment of a colored embedding resin in the multi-layer wiring board having the aforementioned structure is advantageous in that generation of unwanted parasitic capacitance (e.g., inductance) can be prevented; there can be prevented random reflection of light, which would otherwise raise problems when a wiring pattern is formed through exposure and development on an insulating layer built up on the embedding resin; and non-uniformity in color of the resin during curing thereof can be reduced.

The following process may be used to produce a multi-layer wiring board including a substrate in which a build-up layer (which is formed by laminating an insulating layer and a wiring layer alternately) is formed on at least one surface of a core substrate, and an opening is formed so as to penetrate the core substrate and the build-up layer (see FIGS. 11 through 25).

Embodiments

Figure 12:
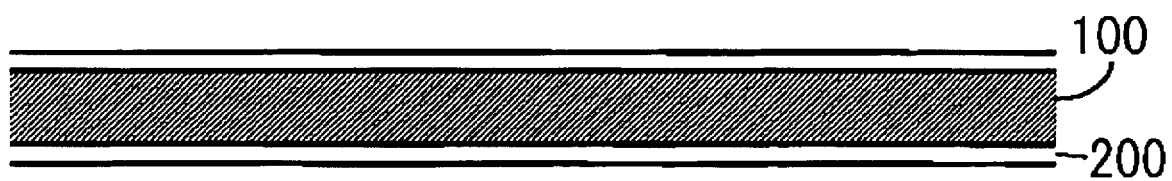
FIG. 12 is a schematic representation of a copper-applied core substrate having a thickness of about 400 $\mu$m.
Figure 13:
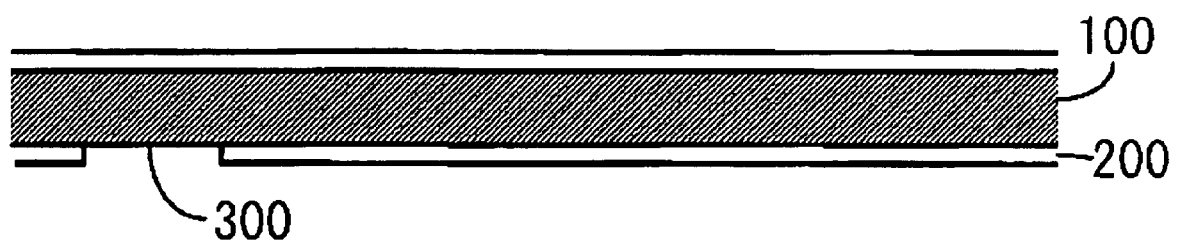
FIG. 13 is an explanatory view showing the state after the copper-applied core substrate having a thickness of about 400 $\mu$m has been subjected to patterning.

The production process of a wiring board having an "FC-PGA" structure shown in FIG. 11 will next be described. As shown in FIG. 12, a core substrate including an FR-5-made insulating substrate 100 (thickness is about 0.4 mm) and copper foil 200 (thickness is about 18 μm) applied on respective surfaces of the insulating substrate is prepared. Properties of the core substrate are as follows: glass transition temperature (Tg) as measured by means of TMA is about 175° C.; coefficient of thermal expansion (CTE) in a direction parallel to the substrate surface is about 16 ppm/° C.; coefficient of thermal expansion (CTE) in a direction perpendicular to the substrate surface is about 50 ppm/° C.; dielectric constant (ε) at 1 MHz is about 4.7; and tan δ at 1 MHz is about 0.018.

A photoresist film is applied onto the core substrate, and then subjected to exposure and development, to thereby form an opening having a diameter of about 600 μm and another opening (not illustrated) corresponding to a predetermined wiring shape. The copper foil exposed to the opening of the photoresist film is removed through etching by use of an etching solution containing sodium sulfite and sulfuric acid. Subsequently, the photoresist film is exfoliated, to thereby obtain a core substrate having an exposure portion 300 shown in FIG. 13 and another exposure portion (not illustrated) corresponding to a predetermined wiring shape.

The core substrate is subjected to etching by use of a commercially available etching apparatus (CZ treatment apparatus, product of Mec), to thereby roughen the surface of the copper foil. Thereafter, an insulating film predominantly containing an epoxy resin (thickness is about 35 μm) is applied onto both surfaces of the core substrate. Subsequently, the film is cured at about 170° C. for 1.5 hours to thereby form an insulating layer. Properties of the cured insulating layer are as follows: glass transition temperature (Tg) as measured by means of TMA is about 155° C.; glass transition temperature (Tg) as measured by means of DMA is about 204° C.; coefficient of thermal expansion (CTE) is about 66 ppm/° C.; dielectric constant (ε) at 1 MHz is about 3.7; tan δ at 1 MHz is about 0.033; percent weight loss at 300° C. is about 0.1%; percent water absorption is about 0.8%; moisture absorption percentage is about 1%; Young's modulus is about 3 GHz; tensile strength is about 63 MPa; and percent expansion is about 4.6%.

Figure 14:
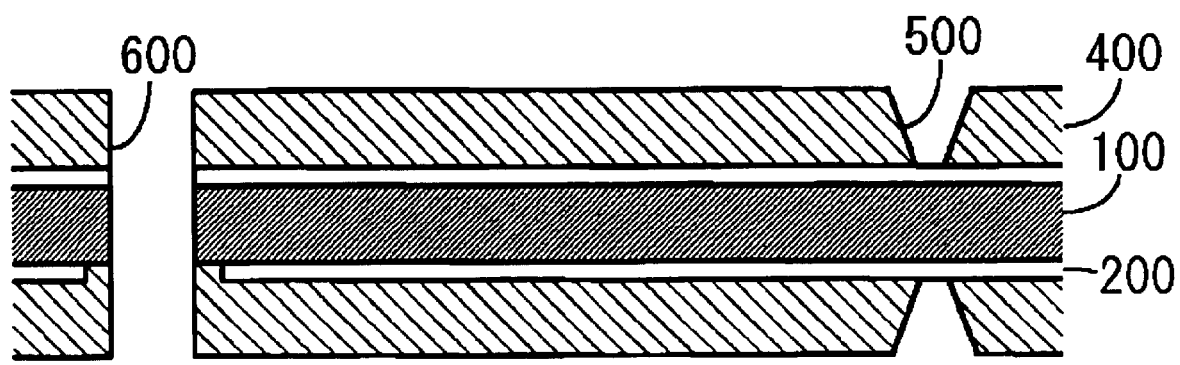
FIG. 14 is an explanatory view showing the state after via holes and a through hole have been formed in a substrate including the core substrate and insulating layers formed on both surfaces of the core substrate.

As shown in FIG. 14, a via hole 500 for connecting layers is formed in the insulating layer 400 by use of a carbon dioxide gas laser. The via hole assumes a mortar-like shape, and has a top diameter of about 120 μm and a bottom diameter of about 60 μm. Furthermore, by use of a carbon dioxide gas laser of high power, a through hole 600 (diameter of about 300 μm) is formed so as to penetrate the insulating layer 400 and the core substrate. The inner wall surface of the through hole assumes a wavy form (not illustrated) attributed to laser processing. Subsequently, the substrate is soaked in a catalyst activation solution containing palladium chloride, and then the entire surface of the substrate is subjected to electroless copper plating (not illustrated).

Subsequently, the entire surface of the substrate is subjected to copper panel plating, to thereby form a copper layer 700 (thickness of about 18 $\mu$m). Through copper plating, a via hole conductor 800 for electrically connecting layers is formed in via hole 500. In addition, a through hole conductor 900 for electrically connecting the top and bottom surfaces of the substrate is formed in through hole 600. The resultant substrate is subjected to etching by use of a commercially available etching apparatus (CZ treatment apparatus, product of Mec), to thereby roughen the surface of the copper layer. Thereafter, the substrate is subjected to rust preventive treatment (such as the trademark CZ treatment) making use of a rust preventive agent produced by Mec, to thereby form a hydrophobic surface. The contact angle ($\theta$) of the hydrophobic surface with respect to water as measured through a sessile drop method making use of a contact angle measurement apparatus (such as CA-A, product of Kyowa Interface Science Co., Ltd.) is about 101°.

Unwoven paper is provided on a pedestal equipped with a vacuum suction apparatus, and the above-treated substrate is placed on the pedestal. A stainless steel mask having a through hole whose position corresponds to the position of the through hole 600 is provided on the substrate. Subsequently, a paste containing a copper filler is placed on the mask, and the through hole 600 is filled with the paste by use of a roller-type squeegee under pressurization.

Figure 15:
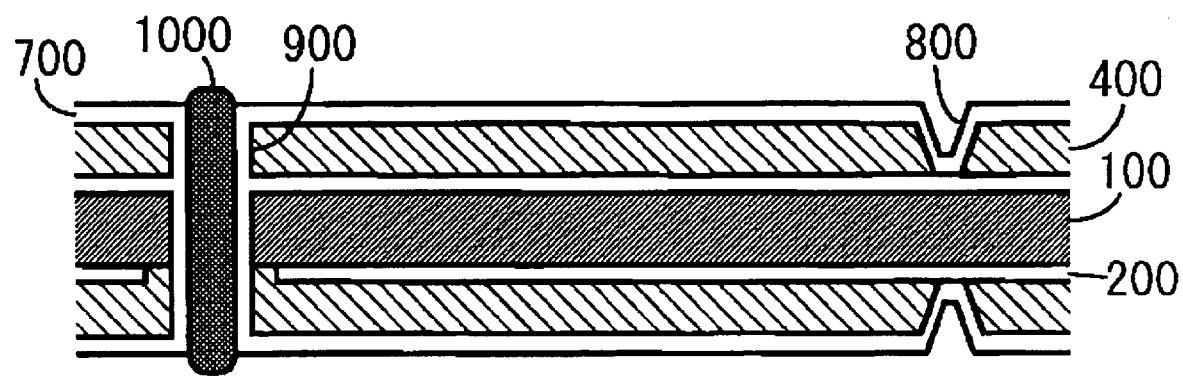
FIG. 15 is an explanatory view showing the state after the substrate including the core substrate and the insulating layers formed on both surfaces of the core substrate have been subjected to panel plating.
Figure 16:
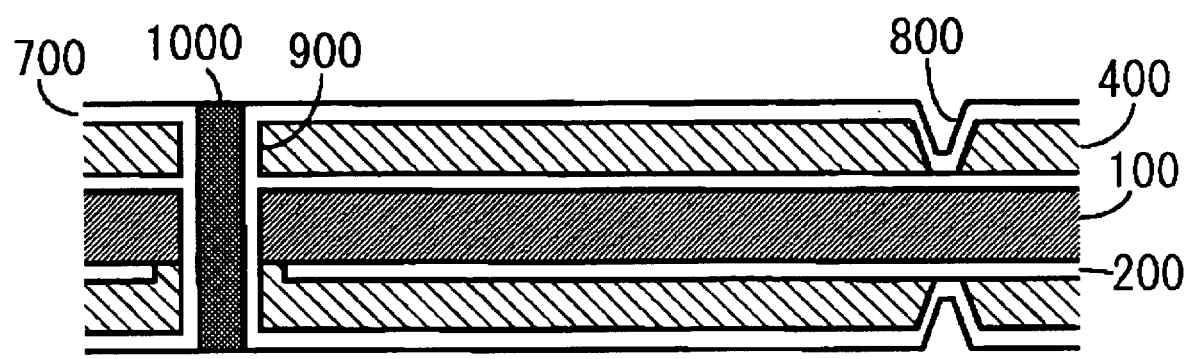
FIG. 16 is an explanatory view showing the substrate in which the through hole is filled with an embedding resin.

As shown in FIG. 15, the paste 1000 in the through hole 600 is pre-cured at about 120° C. for 20 minutes. Subsequently, as shown in FIG. 16, the surface of the substrate is subjected to polishing (rough polishing) by use of a belt sander, and then subjected to buffing (finishing polishing), to thereby planarize the surface. Subsequently, the paste is cured at about 150° C. for five hours, to thereby complete the step of embedding the through hole. A portion of the resultant substrate is employed for evaluation of hole-embedding property.

Figure 17:
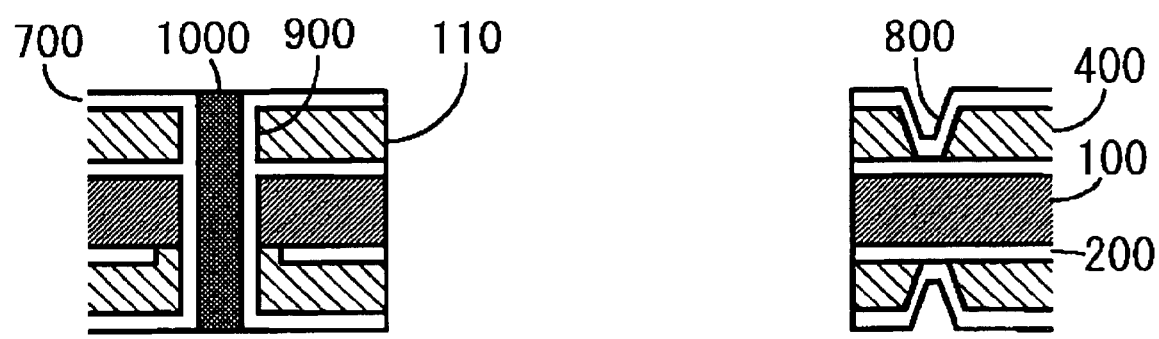
FIG. 17 is an explanatory view showing the substrate having a through hole formed by punching.
Figure 18:
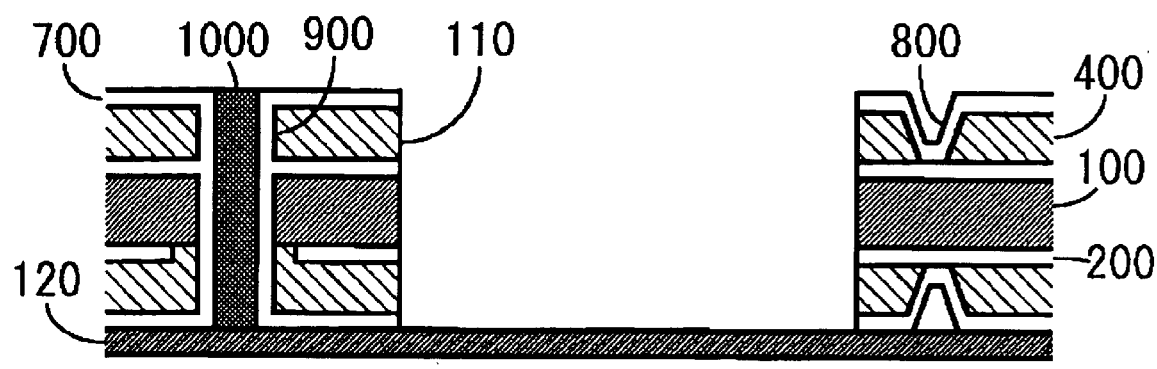
FIG. 18 is an explanatory view showing the state after a masking tape has been applied onto one surface of the substrate having the through hole formed by punching.
Figure 19:
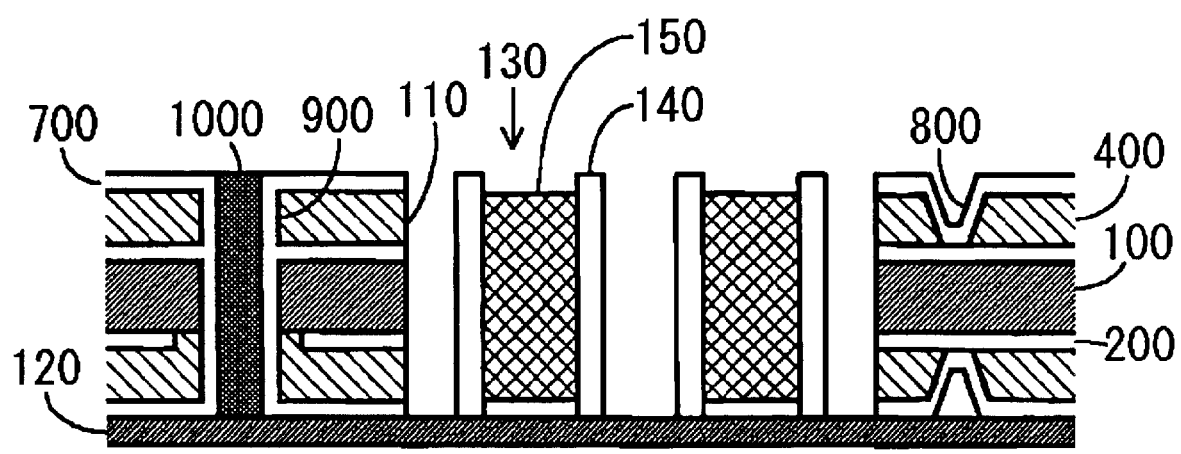
FIG. 19 is an explanatory view showing the state after laminated chip capacitors have been disposed on a portion of the masking tape, the portion being provided in the through hole.

As shown in FIG. 17, a square through hole (opening) 110 (having a size of about 8 mm×8 mm) is formed by use of a die (not illustrated). Subsequently, as shown in FIG. 18, a masking tape 120 is applied onto the bottom surface of the substrate. Subsequently, as shown in FIG. 19, eight laminated chip capacitors 130 are mounted on a portion of the masking tape by use of a chip mounter, the portion being located in the through hole 110. Each of the laminated chip capacitors includes a laminated body 150 and electrodes 140, each electrode having a height of about 70 $\mu$m greater than that of the laminated body.

Figure 20:
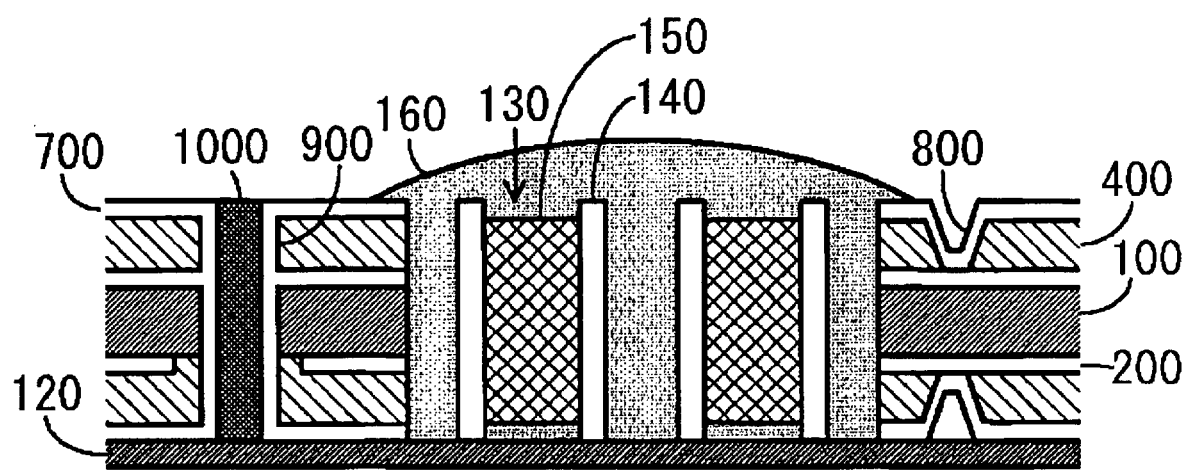
FIG. 20 is an explanatory view showing the state after the through hole has been filled with an embedding resin.

As shown in FIG. 20, by use of a dispenser (not illustrated) the through hole 110 in which the laminated chip capacitors 130 are provided is filled with an embedding resin 160 of the present invention. The embedding resin is subjected to defoaming and curing by the following steps: a primary heating step (about 80° C.×three hours) and a secondary heating step (about 170° C.×six hours).

Figure 21:
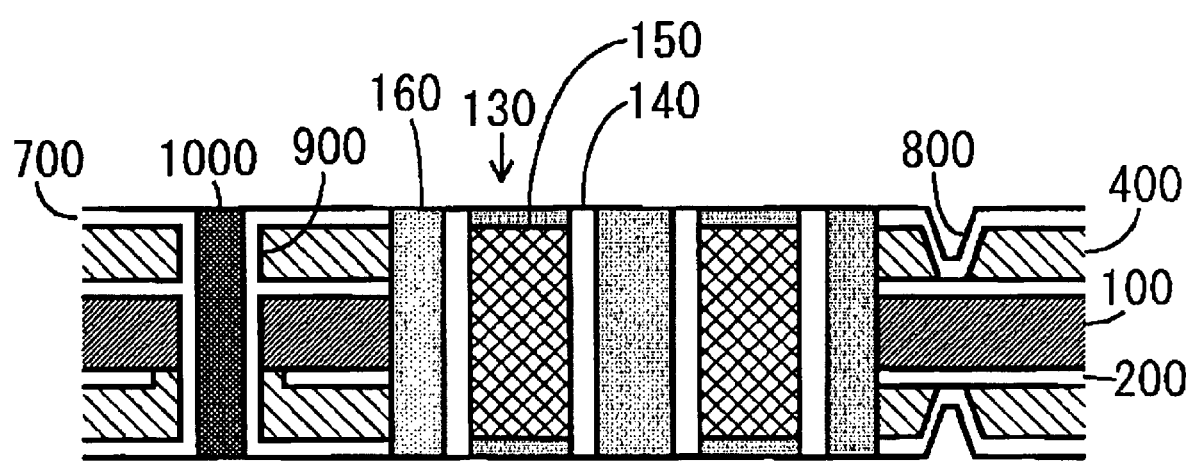
FIG. 21 is an explanatory view showing the state after the surface of the substrate has been planarized through polishing.

As shown in FIG. 21, the surface of the cured embedding resin 160 is subjected to rough polishing by use of a belt sander, and then finished through lap polishing. The end surfaces of electrodes 140 of chip capacitors 130 are exposed to the polished surface of the embedding resin. Subsequently, pre-cured embedding resin 160 is cured at about 150° C. for five hours.

Figure 22:
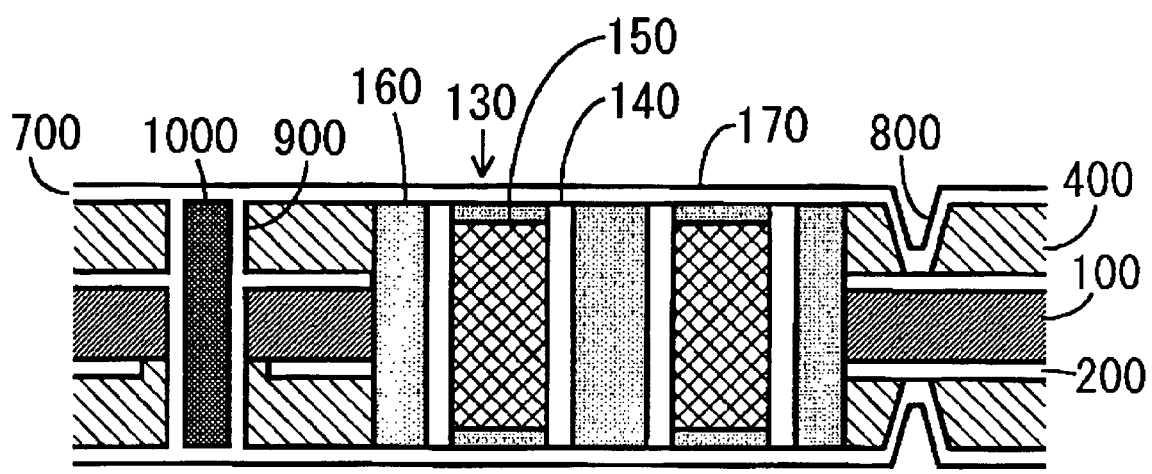
FIG. 22 is an explanatory view showing the state after the polished surface of the substrate has been subjected to panel plating.
Figure 23:
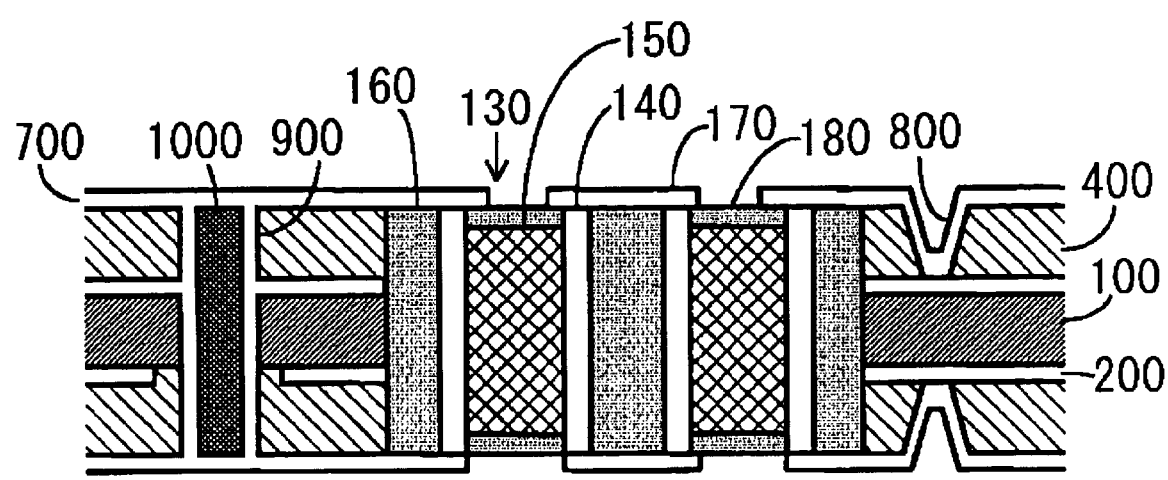
FIG. 23 is an explanatory view showing the state after wiring has been formed through patterning.
Figure 24:
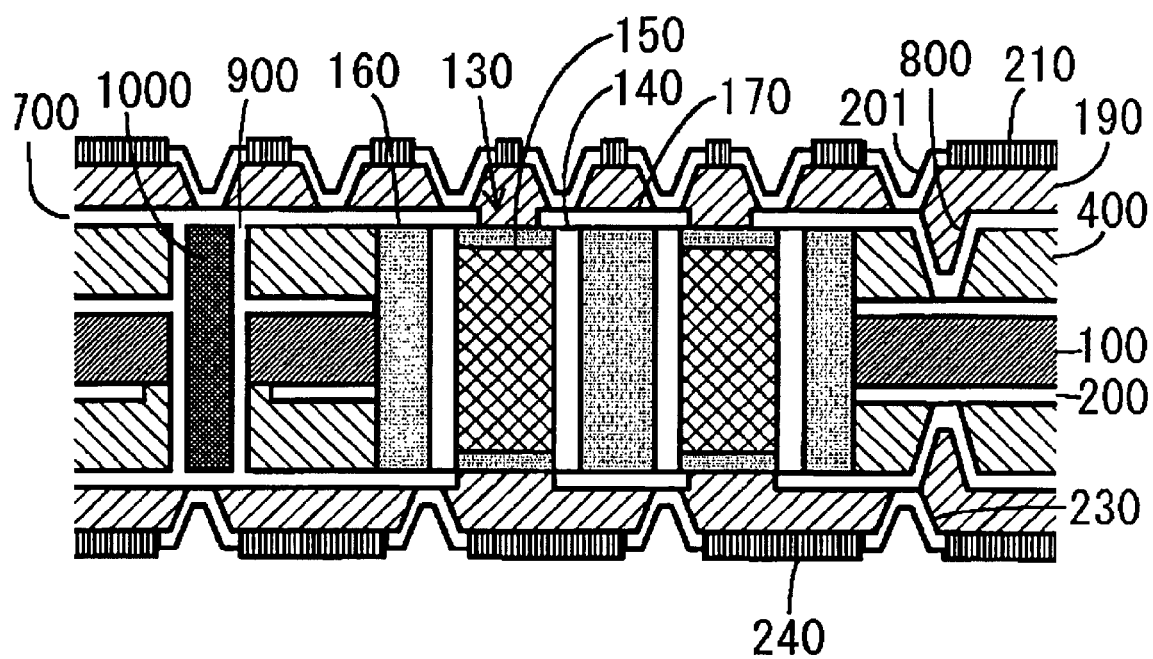
FIG. 24 is an explanatory view showing the state after a build-up layer and a solder resist layer have been formed on the substrate.
Figure 25:
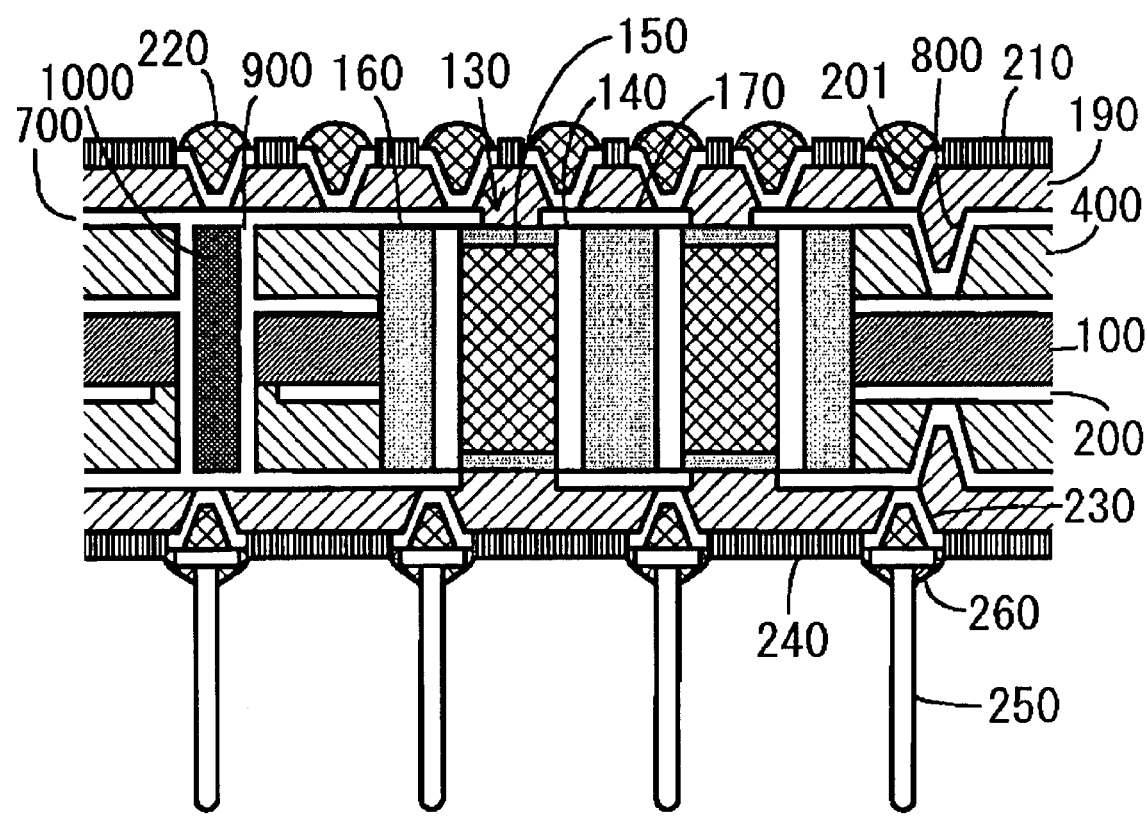
FIG. 25 is an explanatory view showing a FC-PGA-type multi-layer printed wiring board, which is an embodiment of the present invention.

Thereafter, the polished surface of embedding resin 160 is roughed by use of a swelling solution and a $KMnO_4$ solution. After the roughed surface is activated by use of a Pd catalyst, the surface is subjected to electroless plating and then electroplating, to thereby form a copper plating layer. As shown in FIG. 22, plating layer 170 formed on the embedding resin is electrically connected to the end surfaces of electrodes 140 of chip capacitors 130. A resist is formed on the plating layer, and a predetermined wiring pattern is formed through patterning. Unwanted copper is removed through etching by use of $Na_2S_2O_8$/concentrated sulfuric acid. Subsequently, the resist is removed, to thereby complete formation of wiring as shown in FIG. 23. The surface of the resultant copper wiring is roughed through etching by use of a commercially available etching apparatus (CZ treatment apparatus, which is a product of Mec).

On the copper wiring, a film 190 to serve as an insulating layer is laminated, and then cured through heating. Thereafter, the film is irradiated with a carbon dioxide gas laser, to thereby form via holes for connecting layers. The surface of the insulating layer is roughed by use of the aforementioned oxidizing agent, and predetermined wiring 201 is formed on the insulating layer in a manner similar to that described above. A dry film, which is to serve as a solder resist layer, is laminated on the outermost surface of the wiring substrate, and a mounting pattern of a semiconductor element is formed on the dry film through exposure and development, to thereby form a solder resist layer 210. On the bottom surface of the substrate to which pins for mounting are to be attached, predetermined wiring 230 and a solder resist layer 240 are formed in a manner similar to that described above, to thereby produce a multi-layer printed wiring board shown in FIG. 24 on which the pins are not attached.

Terminal electrodes 201 on which a semiconductor element is to be mounted are subjected to Ni plating and then Au plating (not illustrated). After a solder paste containing low-melting-point solder is printed on the plated electrodes, solder bumps 220 for mounting a semiconductor element are formed through use of a solder reflow furnace.

On the surface opposite to the surface on which a semiconductor element is to be mounted, a solder paste containing high-melting-point solder is printed, and then solder bumps 260 for attaching pins are formed by means of a solder reflow furnace. While the wiring board is provided pins 250 set on a jig (not illustrated), the wiring board is placed in a solder reflow furnace (not illustrated), to thereby attach the pins to the wiring board, thereby producing an FC-PGA-type multi-layer printed wiring board shown in FIG. 25 to which a semiconductor element is not attached. The distance between the position of the tip of each of the pins 250 (which are attached on the region corresponding to opening 110 which has been filled with embedding resin 160) and the position of the tip as planned is less than or equal to about 0.1 mm, which is practically acceptable, as measured by use of a projector.

A semiconductor element 270 is disposed on a position of the surface of the wiring board such that the element can be mounted on the wiring board, and then the wiring board is placed in a solder reflow furnace and heated at a temperature at which only low-melting-point solder 220 is melted, to thereby mount the semiconductor element on the wiring board. Subsequently, the mounted portion is filled with an underfill material 300 by means of a dispenser, and then the material is cured through heating, to thereby produce a semiconductor device shown in FIG. 11 including the FC-PGA-type multi-layer printed wiring board on which the semiconductor element 270 is mounted.

Figure 1:
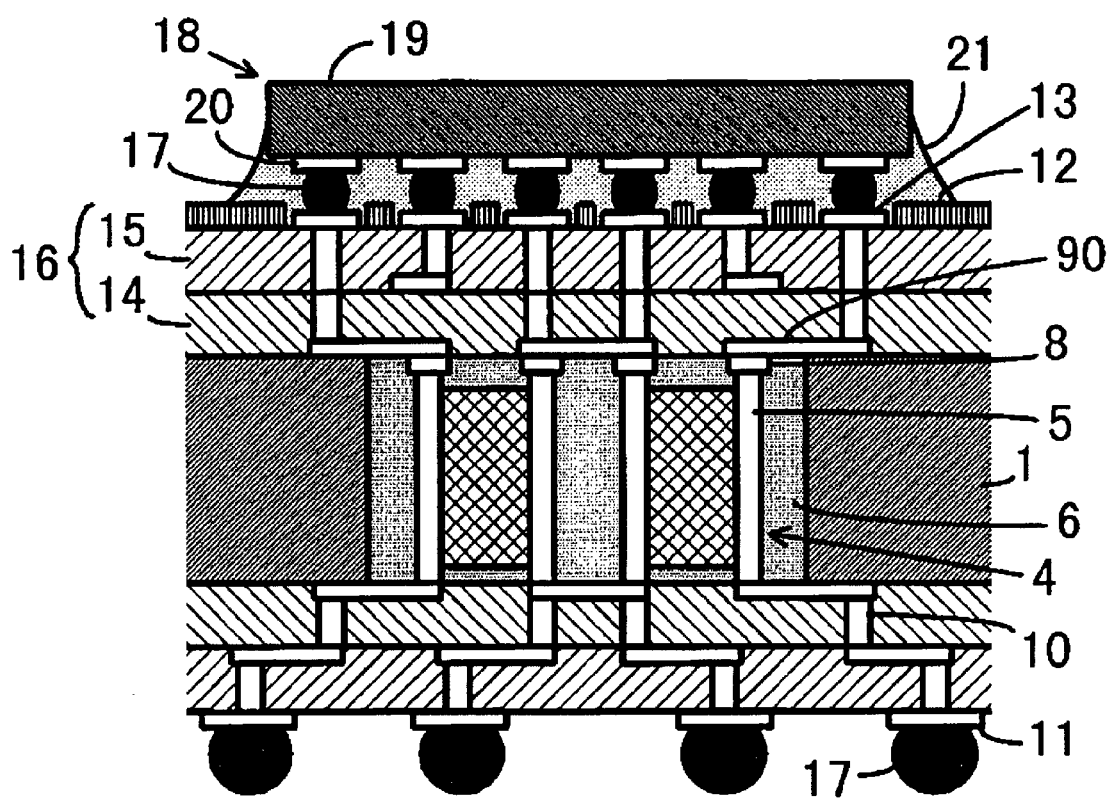
FIG. 1 is an explanatory view showing a BGA board formed from a wiring board of the present invention.
Figure 2:
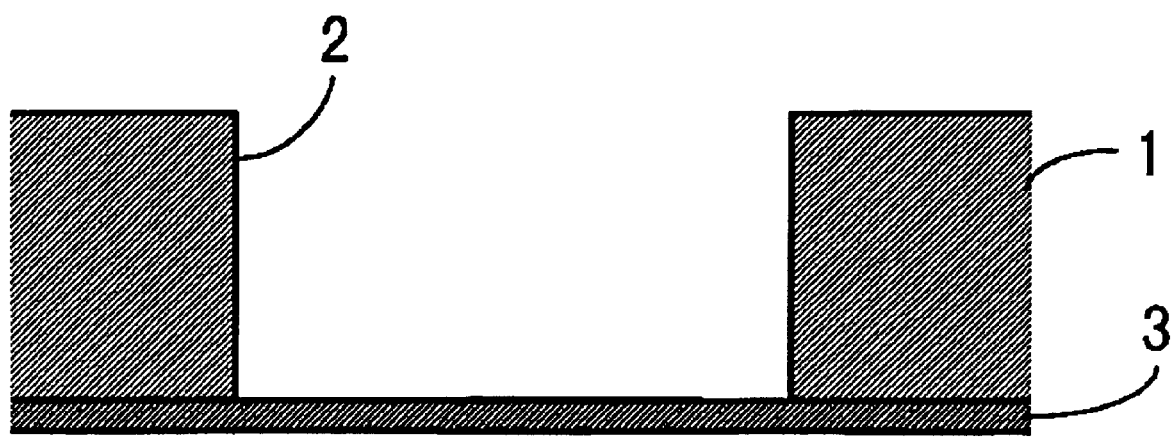
FIG. 2 is an explanatory view showing an embodiment of the production process of a wiring board of the present invention.

Another embodiment of the wiring board of the present invention shown in FIG. 1 will next be described in detail. The wiring board can be produced through the below-described process. As shown in FIG. 2, a through hole (opening: 2) of predetermined size is formed in a core substrate 1 by use of a die; a backing tape 3 is applied onto a first surface of the core substrate; and the core substrate is placed such that the backing tape is located below the core substrate.

Figure 3:
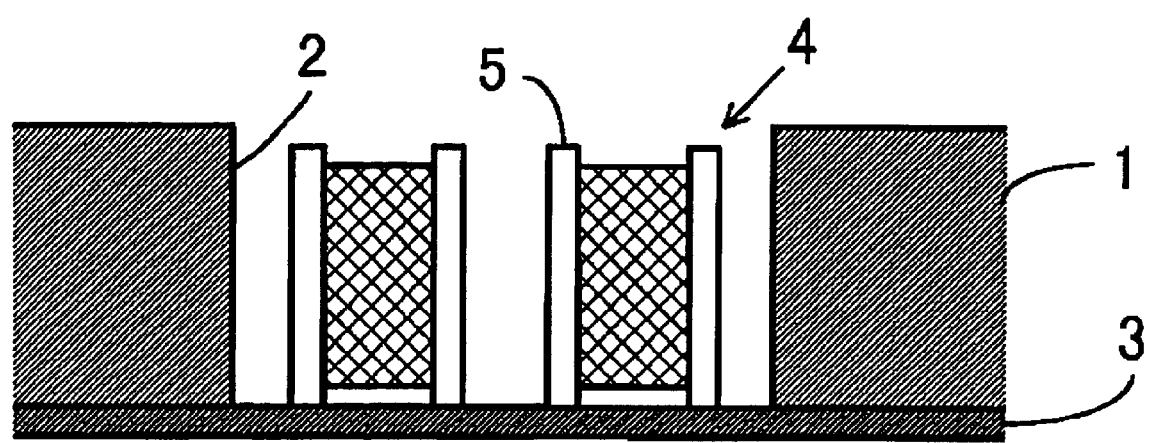
FIG. 3 is another explanatory view showing the embodiment of the production process of the wiring board of the present invention.
Figure 4:
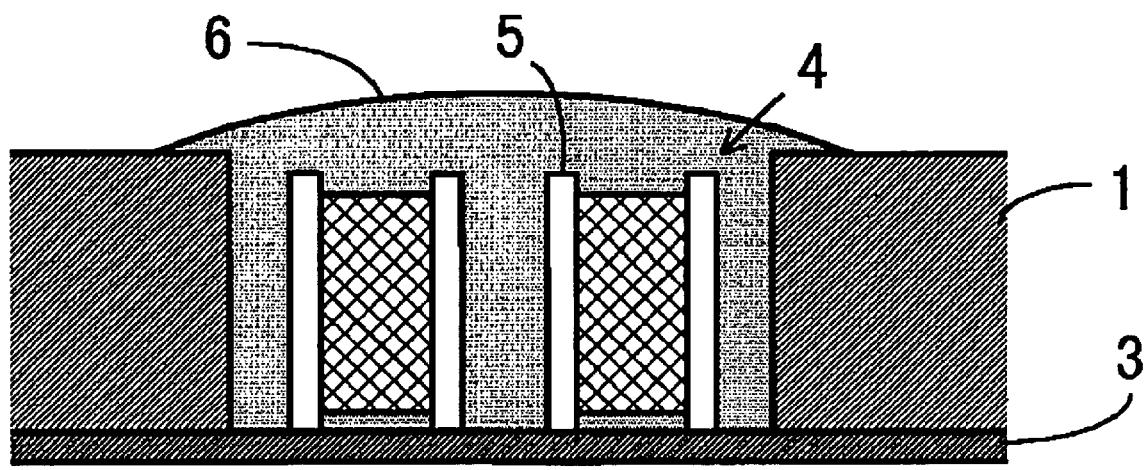
FIG. 4 is yet another explanatory view showing the embodiment of the production process of the wiring board of the present invention.

As shown in FIG. 3, chip capacitors 4 are mounted at predetermined positions of an adhesive surface of backing tape 3 by use of a chip mounter, the surface being located in opening 2. In order to embed the chip capacitor in an embedding resin effectively, the chip capacitor preferably has electrodes 5 projecting from the capacitor main body. As shown in FIG. 4, by use of a dispenser an embedding resin 6 of the present invention is fed into spaces between the opening and chip capacitors 4 provided in opening 2.

Figure 5:
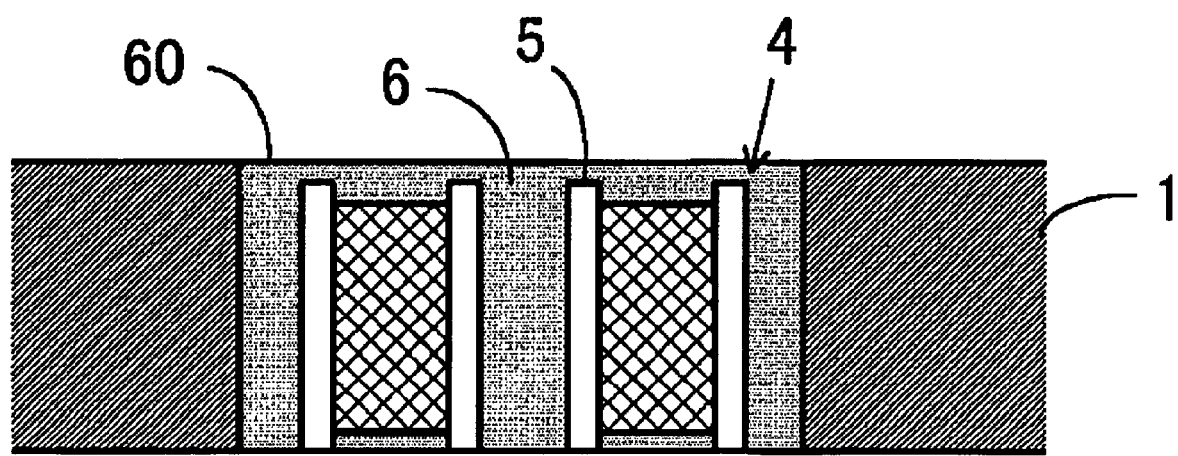
FIG. 5 is yet another explanatory view showing the embodiment of the production process of the wiring board of the present invention.

Embedding resin 6 is subjected to defoaming and curing at about 100° C. for 80 minutes, at about 120° C. for 60 minutes, and at about 160° C. for 10 minutes. The surface of the cured embedding resin is subjected to rough polishing by use of a belt sander, and then finished through lap polishing. FIG. 5 shows surface 60 of embedding resin 6 after polishing.

Figure 6:
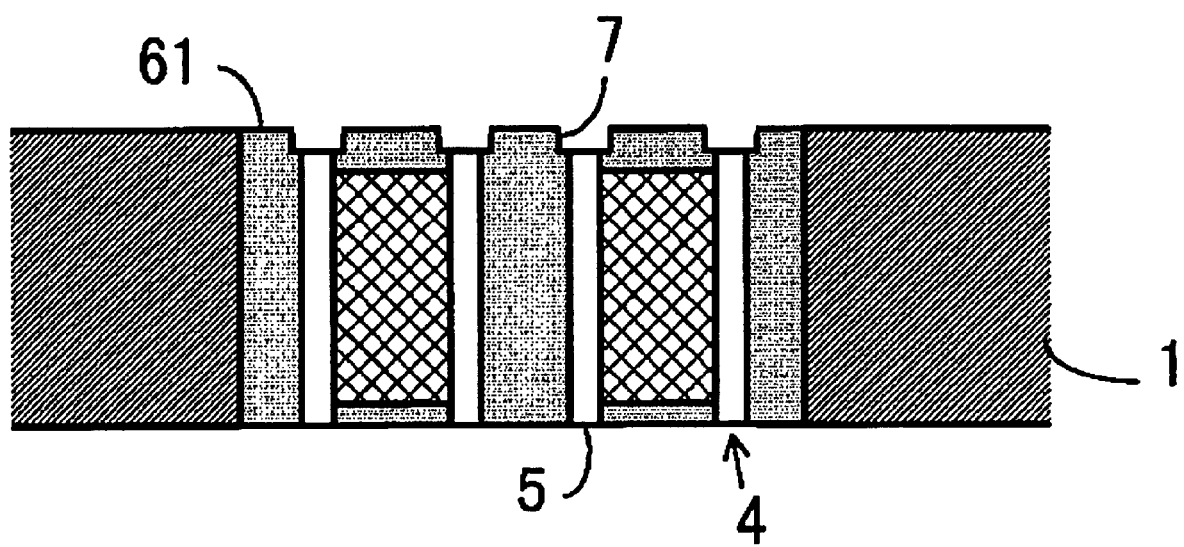
FIG. 6 is yet another explanatory view showing the embodiment of the production process of the wiring board of the present invention.

Subsequently, as shown in FIG. 6, via holes 7 are formed by means of a carbon dioxide gas laser, to thereby expose electrodes 5 of chip capacitors 4.

Figure 7:
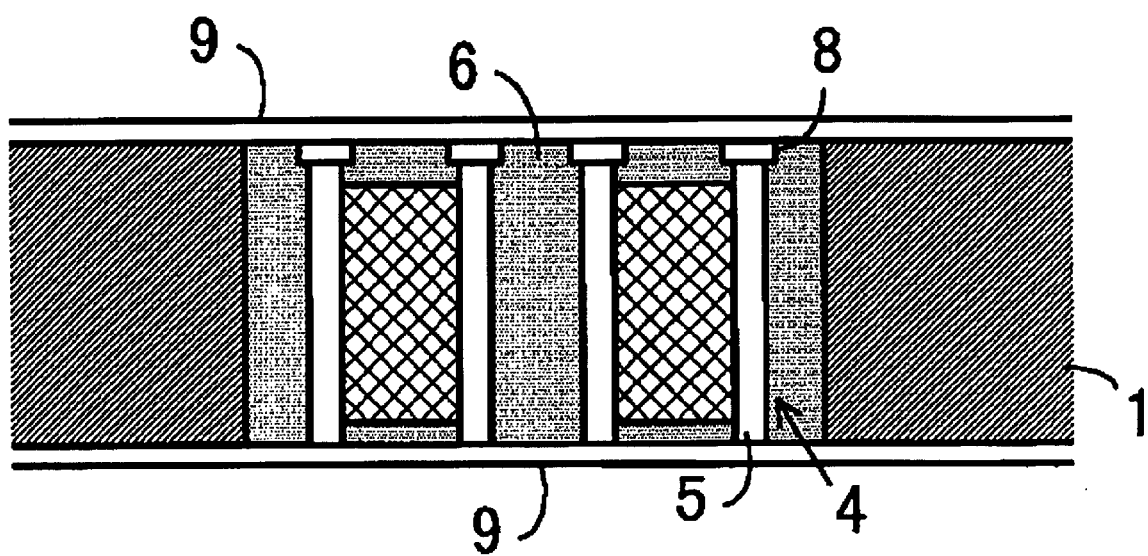
FIG. 7 is yet another explanatory view showing the embodiment of the production process of the wiring board of the present invention.
Figure 8:
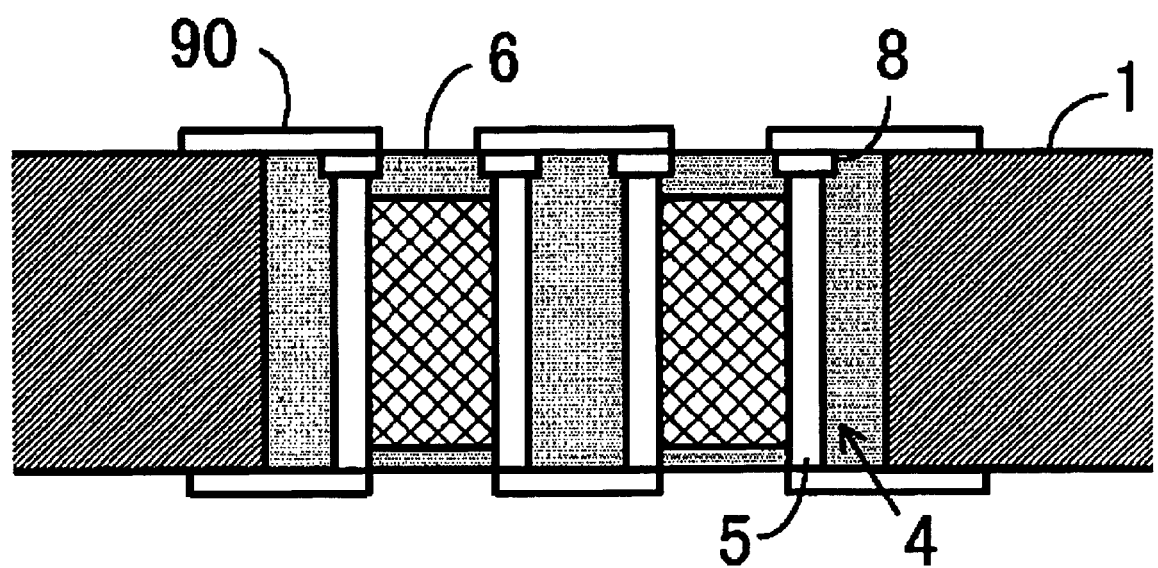
FIG. 8 is yet another explanatory view showing the embodiment of the production process of the wiring board of the present invention.

Thereafter, an exposure surface 61 of embedding resin 6 is roughed by use of a swelling solution and a $KMnO_4$ solution. After the roughed surface is activated by use of a Pd catalyst, the surface is subjected to electroless plating and then electroplating, to thereby form a copper plating layer 9. FIG. 7 shows the state after copper plating. A resist (not illustrated) is formed on the plating layer, and a predetermined wiring pattern is formed through patterning. Unwanted copper is removed through etching by use of $Na_2S_2O_8$/concentrated sulfuric acid. Subsequently, the resist is removed, to thereby complete formation of wiring 90. FIG. 8 shows the state after formation of the wiring.

Figure 9:
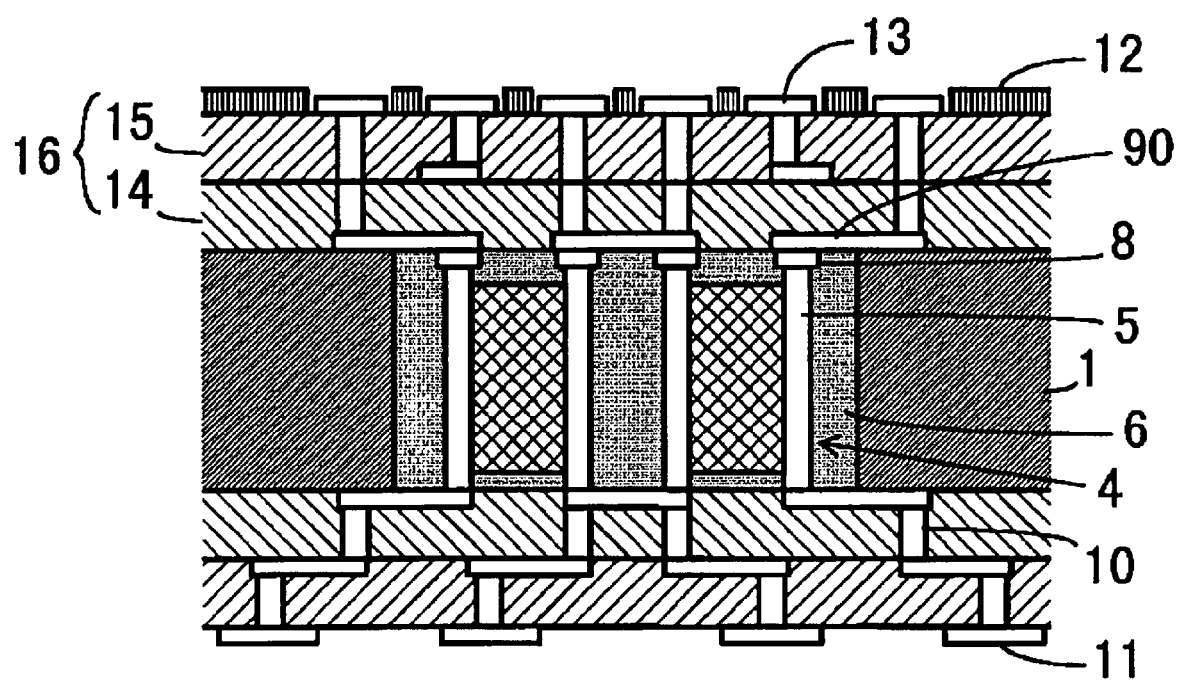
FIG. 9 is yet another explanatory view showing the embodiment of the production process of the wiring board of the present invention.

On the wiring, films 14, 15 are laminated to serve as insulating layers, and then cured through heating. Thereafter, the films are irradiated with a laser, to thereby form via holes for connecting the layers. The surface of the outer insulating layer is roughed by use of the aforementioned oxidizing agent, and a predetermined wiring pattern is formed on the insulating layer in a manner similar to that described above. A dry film, which is to serve as a solder resist layer, is laminated on the outermost surface of the wiring substrate, and a mounting pattern of a semiconductor element is formed on the dry film through exposure and development, to thereby form solder resist layer 12. FIG. 9 shows the state after formation of the solder resist layer.

Terminal electrodes 13 on which a semiconductor element is to be mounted are subjected to Ni plating and then Au plating. Thereafter, semiconductor element 18 is mounted on the terminal electrodes through use of a solder reflow furnace. Before the element is mounted, solder balls 17 are formed on the electrodes by use of low-melting-point solder. Spaces between solder balls are filled with an underfill material 21 by use of a dispenser, and the material is cured through heating, to thereby produce the intended wiring substrate shown in FIG. 1.

EXAMPLES

Effects exerted by the wiring board of the present invention will next be described by way of examples in which test samples are employed. An embedding resin was prepared as follows: components were weighed so as to attain a formulation shown in Table 1 and mixed together, and the resultant mixture was kneaded by use of a three-roll mill. Items shown in Table 1 will next be described in detail.

TABLE 1

| Sample No. | 1 | 2 | 3 | 4 | 5 | 6 | 7 | 8 | 9 |
| --- | --- | --- | --- | --- | --- | --- | --- | --- | --- |
| Epoxy resin | HP-4032D | HP-4032D | E-807 | YL-980 | HP-4032D | N-740 | HP-4032D | E-152 | N-740 |
| Curing agent | QH-200 | B-570 | QH-200 | B-650 | YH-306 | YH-300 | YH-300 | B-650 | B-650 |
| Accelerator | 2P4MHZ | 2P4MHZ | 2P4MHZ | 2P4MHZ | 2P4MHZ | 2P4MHZ | 2P4MHZ | 2P4MHZ | 2P4MHZ |
| Filler | TSS-6 | TSS-6 | TSS-6 | TSS-6 | TSS-6 | TSS-6 | TSS-6 | TSS-6 | TSS-6 |
| Content | 65% | 65% | 65% | 65% | 65% | 65% | 65% | 65% | 65% |
| Carbon | #4300 | #4300 | #4300 | #4300 | #4300 | #4300 | #4300 | #4300 | #4300 |
| Content | 0% | 0.1% | 0.2% | 0.3% | 0.5% | 1.0% | 1.5% | 2.0% | 2.5% |

Epoxy Resin
  HP-4032D is a naphthalene-type epoxy resin of high purity (product of Dainippon Ink and Chemicals, Inc.);
  E-807 is a bisphenol-F-type epoxy resin (product of Yuka Shell);
  YL-980 is a bisphenol-A-type epoxy resin (product of Yuka Shell); and
  N-740 is a phenol-novolak-type epoxy resin (product of Dainippon Ink and Chemicals, Inc.).
Curing Agent
  QH-200 is an acid anhydride-based curing agent (product of Nippon Zeon Co., Ltd.);
  B-570 is an acid anhydride-based curing agent (product of DIC);
  B-650 is an acid anhydride-based curing agent (product of DIC);
  YH-306 is an acid anhydride-based curing agent (product of Yuka Shell Epoxy K.K.); and
  YH-300 is an acid anhydride-based curing agent (product of Yuka Shell Epoxy K.K.).
Accelerator (Curing Accelerator)
  2P4MHZ is an imidazole-based curing agent (product of Shikoku Corporation).
Inorganic Filler
  TSS-6 is a silane-coupled filler (product of Tatsumori, maximum particle size as measured by means of particle size distribution: 24 μm).
Carbon Black
  #4300 is a product of Tokai Carbon Co., Ltd.
  "Carbon content" represents the amount of carbon when the total of the amounts of epoxy resin, curing agent, and inorganic filler is taken as 100 mass %. The carbon content of each sample is shown in Table 1. "Filler content" is about 65 mass %, with the total of the amounts of epoxy resin, curing agent, and filler being taken as 100 mass %. The accelerator content is about 0.1 mass %, with the total of the amounts of epoxy resin, curing agent, and filler being taken as 100 mass %. The ratio, on a functional group basis, of the epoxy resin to the curing agent is 100/95. The balance represents the total of the amounts of the epoxy resin and the curing agent. Each of the embedding resin compositions shown in Table 1 was evaluated as follows.

Evaluation of Reliability

A sample for evaluation of dielectric constant and dielectric loss was prepared as follows. First, through screen printing an embedding resin was printed on a copper plate for Hull cell test so as to attain a width of about 60 mm, a length of about 90 mm, and a thickness of about 100 μm. Subsequently, the resin was defoamed and cured by the following three heating steps: heating at about 100° C. for 80 minutes, at about 120° C. for 60 minutes, and at about 160° C. for 10 minutes. A silver paste was applied onto the cured resin through screen printing so as to attain a diameter of about 20 mm. The resultant sample was subjected to measurement of dielectric constant and tan δ by use of an impedance/gain phase analyzer (model: HP4194A, product of HEWLETT PACKARD).

A sample for evaluation of volume resistance was prepared as follows. First, through screen printing, an embedding resin was printed on a copper plate for Hull cell test so as to attain a width of about 60 mm, a length of about 90 mm, and a thickness of about 100 μm. Subsequently, the resin was defoamed and cured by the following three heating steps: heating at about 100° C. for 80 minutes, at about 120° C. for 60 minutes, and at about 160° C. for 10 minutes. The resultant sample was subjected to measurement of volume resistance by use of a high resistance meter (model: HP4339B, product of HEWLETT PACKARD). For measurement of volume resistance, a resistivity cell having a diameter of about 26 mm was employed, charging time was set to 20 seconds, and output voltage was set to about 100 V.

A sample for evaluation of yield during exposure and development and for evaluation of volume resistance was prepared as follows. First, the surface of the above-prepared plate sample was roughed by means of a swelling solution and a $KMnO_4$ solution. The roughed surface was activated by means of a Pd catalyst, and then subjected to electroless plating and electroplating, to thereby form a copper plating layer. A resist was formed on the plating layer, and subjected to exposure and development, to thereby form a comb-shaped wiring pattern having a line width of about 40 μm and a line space of about 20 μm. Unwanted copper was removed through etching by use of $Na_2S_2O_8$/concentrated sulfuric acid. Thereafter, the resist was exfoliated to thereby complete formation of the wiring. The percentage of the samples which have been passed is referred to as "exposure yield."

Criteria for determining whether or not the samples have been passed in the aforementioned evaluations are described below. The evaluation results are shown in Table 2.

Volume resistance: about $1.0 \times 10^{14}$ Ω·cm or more

Dielectric constant: less than or equal to about 5.0 tan δ: less than or equal to about 0.08

Exposure yield: about 95% or more

TABLE 2

| Sample No. | 1 | 2 | 3 | 4 | 5 | 6 | 7 | 8 | 9 |
|---|---|---|---|---|---|---|---|---|---|
| Volume resistance ($\times 10^{14}$ Ω·cm) | 15.4 | 53.0 | 22.2 | 14.6 | 14.7 | 7.82 | 17.1 | 9.82 | $9.25 \times 10^{-5}$ |
| Dielectric constant | 3.78 | 3.83 | 3.88 | 3.98 | 4.07 | 4.42 | 5.46 | 5.78 | 7.27 |
| Evaluation | ○ | ○ | ○ | ○ | ○ | ○ | Δ (some samples are not passed) | Δ (some samples are not passed) | × |
| tan δ | 0.010 | 0.012 | 0.017 | 0.022 | 0.031 | 0.047 | 0.087 | 0.107 | 0.194 |
| Evaluation | ○ | ○ | ○ | ○ | ○ | ○ | × | × | × |
| Exposure yield | 95% | 98% | 97% | 97% | 98% | 97% | 95% | 96% | 95% |
| Evaluation | ○ | ○ | ○ | ○ | ○ | ○ | ○ | ○ | ○ |

The results show that samples Nos. 1 through 6 (Examples) are excellent in terms of all the evaluation items. In contrast, samples Nos. 7 through 9 (Comparative Examples) in which the carbon black content exceeds about 1.4 mass % showed somewhat low volume resistance, elevated dielectric constant and tan δ, and relatively low exposure yield.

Effects of the Invention

The wiring board of the present invention includes an embedding resin having tan δ of less than or equal to about 0.08 and a dielectric constant of less than or equal to about 5, the resin being used for embedding electronic components in the wiring board. Therefore, excellent dielectric properties; i.e., high volume resistance, low tan δ, and low dielectric constant, and excellent electrical properties can be obtained. In addition, random reflection of light during formation of a wiring pattern through exposure can be prevented, to thereby increase production yield of the wiring board. When the amount of carbon black incorporated into the embedding resin employed is determined so as to fall within a specific range, the aforementioned dielectric properties can be further improved. Furthermore, excellent insulating property (i.e., a volume resistance of about $1.0 \times 10^{14}$ Ω·cm) can be obtained.

Although the foregoing description is directed to the preferred embodiments of the invention, it is noted that other variations and modifications will be apparent to those skilled in the art, and may be made without departing from the spirit or scope of the invention.

What is claimed is:

1. A wiring board comprising:

a core substrate defining an opening;

an electronic component;

an embedding resin having a dielectric constant of less than or equal to about 5 and tan δ of less than or equal to about 0.08; and a substrate in which a build-up layer formed by laminating an insulating and a wiring layer in alternate fashion is formed, wherein, said electronic component is embedded in the opening by said embedding resin, wherein the substrate in which the build-up layer is formed is disposed across the opening and in contiguous contact with the core substrate and the embedding resin, wherein the electronic component includes an electrode, and wherein a distance from the electrode to the wiring layer of the substrate in which the build-up layer formed is less than or equal to 100 μm.

2. The wiring board according to claim 1, wherein said embedding resin comprises carbon black in an amount of less than or equal to about 1.4 mass %.

3. The wiring board according to claim 1, wherein said embedding resin comprises a thermosetting resin as a resin component and at least one inorganic filler.

4. The wiring board according to claim 3, wherein said thermosetting resin is at least one of a bisphenol-type epoxy resin, a naphthalene-type epoxy resin, a phenol-novolak-type epoxy resin, or a cresol-novolak-type epoxy resin.

5. The wiring board according to claim 1, wherein said embedding resin assumes a color having a base color tone of black, blue, green, red, orange, yellow, or violet.

6. The wiring board according to claim 1, wherein the distance from the electrode to the wiring layer of the substrate in which the build-up layer formed is less than or equal to 50 μm.

7. The wiring board according to claim 6, wherein the distance from the electrode to the wiring layer of the substrate in which the build-up layer formed is less than or equal to 30 μm.

8. The wiring board according to claim 1, wherein via holes are formed in the insulating layer.

* * * * *